United States Patent
You et al.

(10) Patent No.: US 11,967,352 B2
(45) Date of Patent: Apr. 23, 2024

(54) METHOD OF CONTROLLING ROW HAMMER AND A MEMORY DEVICE

(71) Applicant: SAMSUNG ELECTRONICS CO., LTD., Suwon-si (KR)

(72) Inventors: Jungmin You, Hwaseong-si (KR); Wonhyung Song, Osan-si (KR); Hoyoun Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 170 days.

(21) Appl. No.: 17/741,604

(22) Filed: May 11, 2022

(65) Prior Publication Data

US 2023/0044186 A1 Feb. 9, 2023

(30) Foreign Application Priority Data

Aug. 5, 2021 (KR) .................. 10-2021-0103435

(51) Int. Cl.
*G11C 11/406* (2006.01)
*G11C 11/4093* (2006.01)
*G11C 11/4096* (2006.01)

(52) U.S. Cl.
CPC .. *G11C 11/40615* (2013.01); *G11C 11/40622* (2013.01); *G11C 11/4093* (2013.01); *G11C 11/4096* (2013.01)

(58) Field of Classification Search
CPC ........ G11C 11/40615; G11C 11/40622; G11C 11/4093; G11C 11/4096; G11C 11/40603; G11C 11/4082; G11C 11/40611; G06F 3/0619; G06F 3/0659
See application file for complete search history.

(56) References Cited

U.S. PATENT DOCUMENTS

| | | | |
|---|---|---|---|
| 9,032,141 B2 * | 5/2015 | Bains ................... | G06F 13/1636 |
| | | | 711/106 |
| 10,261,852 B2 | 4/2019 | Benedict et al. | |
| 10,497,409 B2 | 12/2019 | Kilmer et al. | |
| 10,770,127 B2 | 9/2020 | Shore et al. | |
| 10,795,613 B2 | 10/2020 | Roh | |
| 10,860,222 B2 | 12/2020 | Shin et al. | |
| 2018/0190342 A1 * | 7/2018 | Morgan ................ | G11C 11/408 |
| 2019/0347019 A1 * | 11/2019 | Shin ....................... | G06F 3/0629 |
| 2020/0081631 A1 | 3/2020 | Schaefer et al. | |
| 2020/0090729 A1 * | 3/2020 | Son ........................ | G11C 11/406 |

(Continued)

*Primary Examiner* — Khamdan N. Alrobaie
(74) *Attorney, Agent, or Firm* — F. Chau & Associates, LLC

(57) ABSTRACT

A memory device including: a memory cell array including memory cell rows; and a control logic circuit to perform a row, write, read, or pre-charge operation on the memory cell rows in response to an active, write, read, or pre-charge command, wherein the control logic circuit is further configured to: calculate a first count value by counting the active command and a second count value by counting the write command or the read command, with respect to a first memory cell row, during a row hammer monitor time frame; determine a type of row hammer of the first memory cell row based on a ratio of the first count value to the second count value; and adjust a pre-charge preparation time between an active operation and the pre-charge operation, by changing a pre-charge operation time point according to the determined type of row hammer.

20 Claims, 10 Drawing Sheets

(56) References Cited

U.S. PATENT DOCUMENTS

2021/0043248 A1 2/2021 Lee et al.
2023/0094684 A1* 3/2023 Kim .................. G11C 11/40615
                                                                              365/222

* cited by examiner

METHOD OF CONTROLLING ROW HAMMER AND A MEMORY DEVICE

CROSS-REFERENCE TO RELATED APPLICATION

This application claims priority under 35 U.S.C. § 119 to Korean Patent Application No. 10-2021-0103435, filed on Aug. 5, 2021, in the Korean Intellectual Property Office, the disclosure of which is incorporated by reference herein in its entirety.

TECHNICAL FIELD

The inventive concept relates to semiconductor memory devices, and more particularly, to a memory device for monitoring and controlling row hammer.

DISCUSSION OF RELATED ART

Dynamic random access memory (DRAM) is a type of random-access semiconductor memory that stores each bit of data in a memory cell. Systems using semiconductor chips use DRAM as an operating memory or a main memory to store data or instructions used by hosts and/or to perform computational operations. Generally, DRAM writes data or reads data under control of a host. When a host performs a computational operation, the host retrieves instructions and/or data from the DRAM and executes the instructions and/or uses the data to perform the computational operation. When there is a result of the computational operation, the host writes the result to the DRAM.

In order to boost the capacity and the integration of DRAM, a cell size of the DRAM has decreased. Some DRAM-based systems experience intermittent failures due to a heavy workload. These failures may happen due to a repeated access to a single memory cell row, e.g., a row hammer event. Data corruption may occur because memory cells adjacent to the repeatedly accessed memory cell rows are disturbed due to the row hammer condition. The memory cells affected by the row hammer condition may be refreshed by a target refresh operation.

However, the target refresh operation requires a refresh circuit, which may be complex in design. In addition, the issuance of an additional refresh command may generate a scheduling and/or switching load between tasks.

SUMMARY

The inventive concept provides a memory device for controlling row hammer by using an operation of adjusting a pre-charge preparation time by changing a pre-charge operation time point related to a tRAS time parameter, row-rerouting, or blocking commands, according to a type of row hammer, and an operating method of the memory device.

According to an embodiment of the inventive concept, there is provided a memory device including; a memory cell array including a plurality of memory cell rows; a plurality of connectors for connecting the memory device to a device outside of the memory device; a control logic circuit configured to perform a row operation, a write operation, a read operation, or a pre-charge operation on the plurality of memory cell rows in response to an active command, a write command, a read command, or a pre-charge command received from the outside; and an input and output circuit configured to transmit data according to the write operation or the read operation to the plurality of connectors, wherein the control logic circuit is further configured to: calculate a first count value by counting the active command and a second count value by counting the write command or the read command, with respect to a first memory cell row from among the plurality of memory cell rows, during a row hammer monitor time frame; determine a type of row hammer of the first memory cell row based on a ratio of the first count value to the second count value; and adjust a pre-charge preparation time between an active operation and the pre-charge operation, by changing a pre-charge operation time point according to the determined type of row hammer.

According to an embodiment of the inventive concept, there is provided a memory device including: a memory cell array including a plurality of memory cell rows; a plurality of signal pins that are configured to connected to a device outside of the memory device; a control logic circuit configured to perform a row operation, a write operation, a read operation, or a pre-charge operation on the plurality of memory cell rows in response to an active command, a write command, a read command, or a pre-charge command received from the outside; and an input and output circuit configured to transmit data according to the write operation or the read operation to the plurality of signal pins, wherein the control logic circuit is further configured to; calculate a first count value by counting the active command and a second count value by counting the write command or the read command, with respect to a first memory cell row from among the plurality of memory cell rows, during a row hammer monitor time frame; determine a type of row hammer of the first memory cell row based on a ratio of the first count value to the second count value; and reroute access to the first memory cell row to a second memory cell row, according to the determined type of row hammer.

According to an embodiment of the inventive concept, there is provided a memory device including: a memory cell array including a plurality of memory cell rows; a plurality of signal pins that are configured to connected to a device outside of the memory device; a command buffer configured to receive commands through a first part of the plurality of signal pins; a control logic circuit configured to perform a row operation, a write operation, a read operation, or a pre-charge operation on the plurality of memory cell rows in response to an active command, a write command, a read command, or a pre-charge command received through the command buffer; and an input and output circuit configured to transmit data according to the write operation or the read operation to a second part of the plurality of signal pins, wherein the control logic circuit is further configured to: calculate a first count value by counting the active command and a second count value by counting the write command or the read command, with respect to a first memory cell row from among the plurality of memory cell rows, during a row hammer monitor time frame; determine a type of row hammer of the first memory cell row based on a ratio of the first count value to the second count value; and block the active, write, read or pre-charge commands by disabling the command buffer according to the determined type of row hammer.

According to an embodiment of the inventive concept, there is provided an operating method of a memory device including a plurality of memory cell rows, the operating method including: obtaining a first count value by counting an active command with respect to a first memory cell row from among the plurality of memory cell rows during a row hammer monitor time frame, wherein the first memory cell row has a largest number of accesses during the row hammer monitor time frame; obtaining a second count value by counting a write command or a read command with respect to the first memory cell row during the row hammer monitor time frame; determining a type of row hammer of the first memory cell row based on a ratio of the first count value to the second count value; and adjusting a pre-charge preparation time between an active operation in response to the active command and a pre-charge operation in response to a pre-charge command of the memory device by changing a pre-charge operation time point according to the determined type of row hammer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
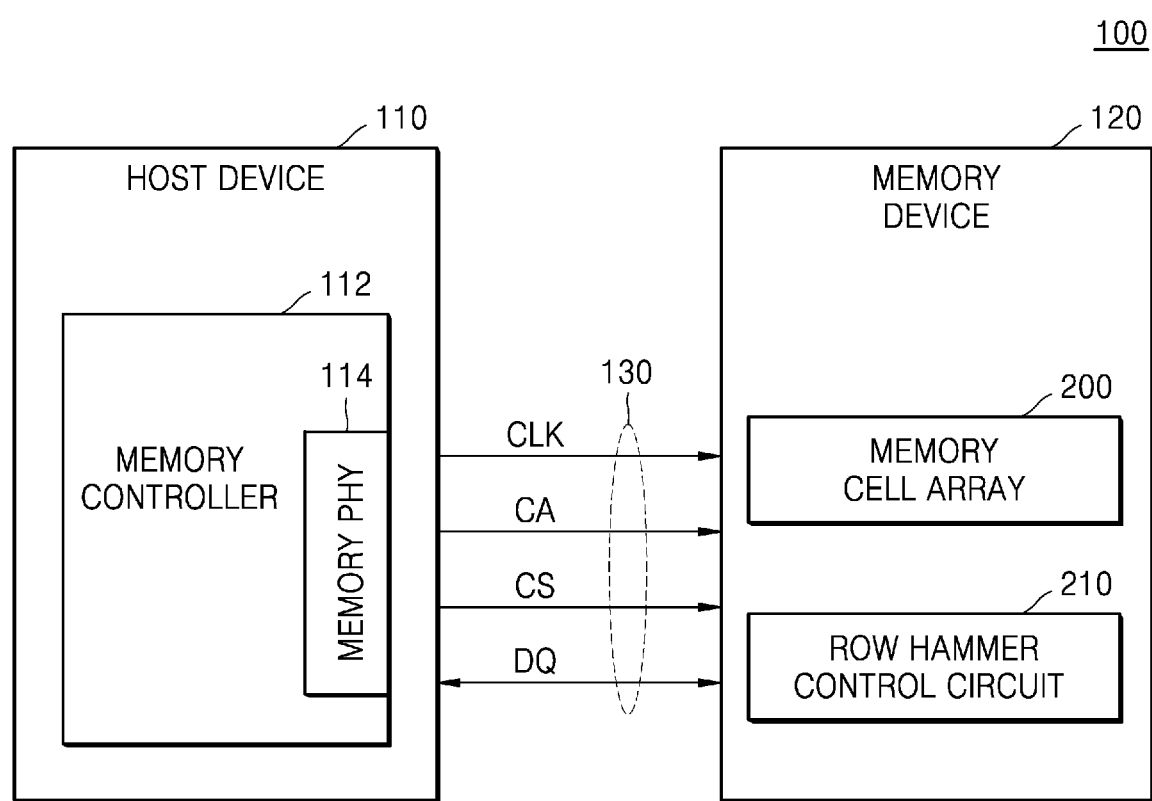
FIG. 1 is a block diagram of a system including a memory device for controlling row hammer, according to example embodiments of the inventive concept.

FIG. 1 is a block diagram of a system 100 including a memory device 120 for controlling row hammer, according to example embodiments of the inventive concept.

Referring to FIG. 1, the system 100 may include a host device 110 and the memory device 120. The host device 110 may be communicatively connected with the memory device 120 through a memory bus 130.

For example, the host device 110 may include a computing system, such as a computer, a notebook computer, a server, a work station, a portable communication terminal, a personal digital assistant (PDA), a portable multimedia player (PMP), a smartphone, and a wearable device. Alternatively, the host device 110 may be one or more components included in the computing system, such as a graphics card.

The host device 110 may be a functional block configured to perform general computer operations in the system 100 and may correspond to a central processing unit (CPU), a digital signal processor (DSP), a graphics processing unit (GPU), or an application processor (AP). The host device 110 may include a memory controller 112 configured to manage transmission and reception of data to and from the memory device 120.

The memory controller 112 may access the memory device 120 in response to a memory request of the host device 110. The memory controller 112 may include a memory physical layer interface 114 for performing interfacing operations with the memory device 120, such as selecting a row and a column corresponding to a memory location, writing data in the memory location, or reading data. The memory physical layer interface 114 may hereinafter be referred to as a memory PHY 114.

The memory controller 112 may control a write operation or a read operation with respect to the memory device 120 by providing a command CMD and an address ADDR to the memory device 120. In addition, data DQ for a write operation and data DQ that is read may be transmitted and received to and from the memory controller 112 and the memory device 120. These memory access operations may be performed by the memory PHY 114 and the memory bus 130 between the memory controller 112 and the memory device 120.

The memory PHY 114 may include physical layers, electrical layers and logical layers provided for signals, frequencies, timings, operations, detailed operation parameters and functionalities that are required for efficient communication between the memory controller 112 and the memory device 120. The memory PHY 114 may support the double data rate (DDR) and/or low power DDR (LPDDR) protocol characteristics according to the joint electron device engineering council (JEDEC) standards.

The memory PHY 114 may connect the memory controller 112 with the memory device 120 through the memory bus 130. For the brevity of the drawings, it is illustrated that a clock signal CLK, a command/address CA, and data DQ are each provided through one signal line between the memory controller 112 and the memory device 120. However, in reality, the clock signal CLK, the command/address CA, and the data DQ may be provided through a plurality of signal lines or a bus. The signal lines between the memory controller 112 and the memory device 120 may be connected through connectors. The connectors may be implemented by pins, balls, signal lines, or other hardware components.

The clock signal CLK may be transmitted from the memory controller 112 to the memory device 120 through a clock signal line of the memory bus 130. The command/address signal CA may be transmitted from the memory controller 112 to the memory device 120 through a command/address bus of the memory bus 130. A chip selection signal CS may be transmitted from the memory controller 112 to the memory device 120 through a chip selection line of the memory bus 130. A signal transmitted through the command/address bus in a state in which the chip selection signal CS is activated to logic high may indicate a command. The data DQ may be transmitted from the memory controller 112 to the memory device 120 or from the memory device 120 to the memory controller 112 through a data bus of the memory bus 130 including bi-directional signal lines.

The memory device 120 may write or read the data DQ or perform a refresh operation according to control by the memory controller 112. For example, the memory device 120 may include dynamic random access memory, such as dynamic random access memory (DRAM), synchronous DRAM (SDRAM), DDR SDRAM, LPDDR SDRAM, or graphics DDR SDRAM (GDDR SDRAM). The memory device 120 may include a memory cell array 200 and a row hammer control circuit 210.

The memory cell array 200 may include a plurality of word lines, a plurality of bit lines, and a plurality of memory cells formed at points at which the word lines and the bit lines cross each other. The memory cells of the memory cell array 200 may include volatile memory cells, for example, DRAM cells.

The row hammer control circuit 210 may obtain a first count value by counting active commands with respect to at least one memory cell row from among a plurality of memory cell rows of the memory cell array 200 during a row hammer monitor time frame. For example, the row hammer control circuit 210 may obtain the first count value by counting the active commands with respect to a memory cell row having the largest number of accesses during the row hammer monitor time frame. For example, the row hammer control circuit 210 may count the number of active commands with respect to each of the memory cell rows and may determine a memory cell row corresponding to the largest number of active commands as the memory cell row having the largest number of accesses. The row hammer control circuit 210 may obtain the largest number of active commands as the first count value. The row hammer control circuit 210 may obtain a second count value by counting write commands or read commands and may determine a type of row hammer of a memory cell row based on a ratio of the first count value to the second count value.

According to an example embodiment of the inventive concept, the row hammer control circuit 210 may change a pre-charge operation time point in response to a pre-charge command of the memory device 120, according to the determined type of row hammer. For example, the row hammer control circuit 210 may adjust a time interval between an active operation and a pre-charge operation (hereinafter, referred to as a pre-charge preparation time) with respect to a specific memory cell row to be increased. For example, the row hammer control circuit 210 may increase the pre-charge preparation time to be N is a natural number equal to or greater than 2) times a tRAS time parameter between an active command CT and a pre-charge command PRECHARGE in a row operation. When the pre-charge operation time point with respect to a specific row is delayed, even when an active command is additionally received with respect to the specific row, an active operation with respect to the specific row may be delayed such that the active operation is performed after the pre-charge operation.

According to an example embodiment of the inventive concept, the row hammer control circuit 210 may reroute rows such that another memory cell row of the memory device 120 is accessed or may block commands of the memory device 120, according to the determined type of row hammer. Thus, the row hammer of the memory device 120 may be alleviated.

Figure 2:
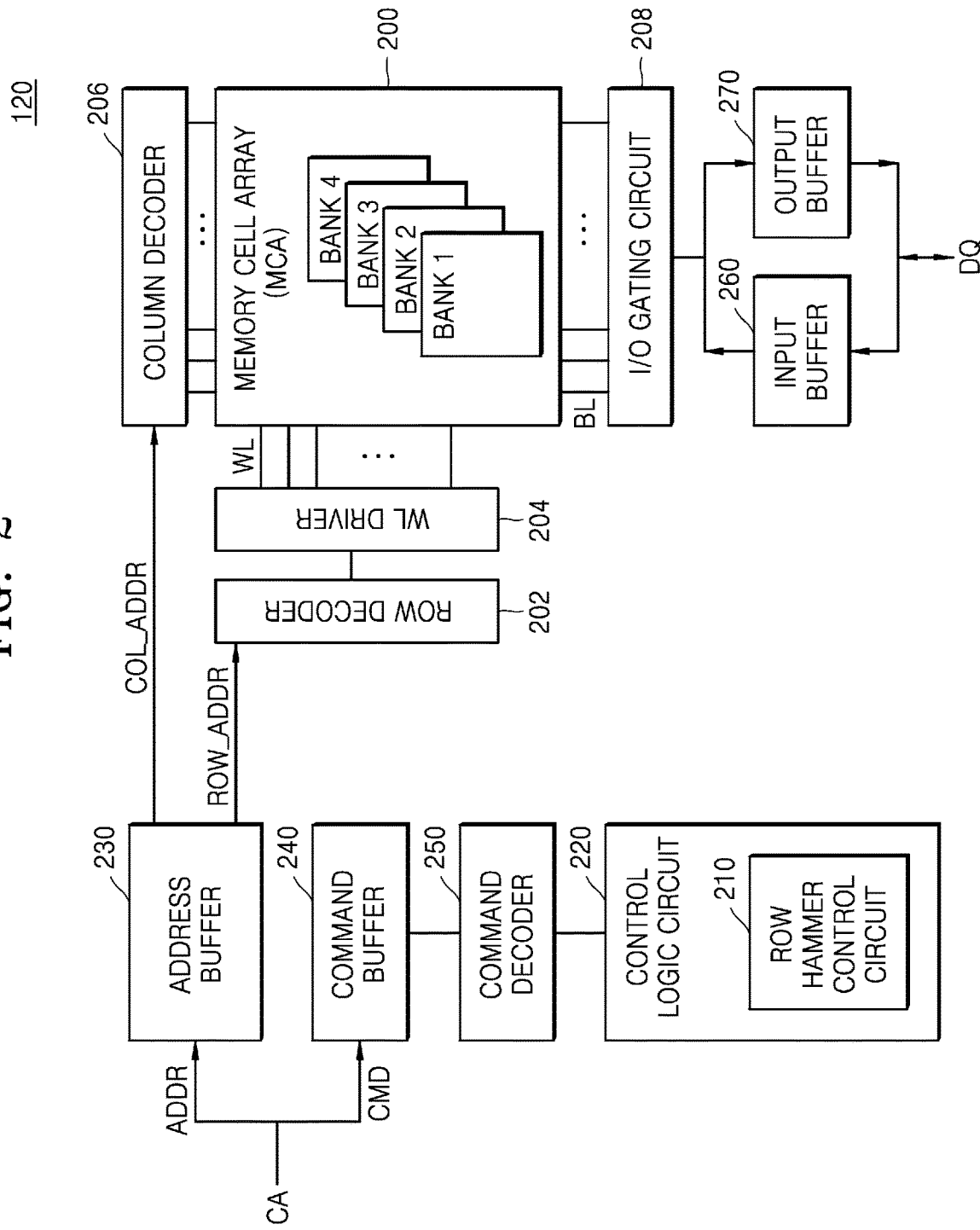
FIG. 2 is a block diagram of a memory device according to example embodiments of the inventive concept.

FIG. 2 is a block diagram of the memory device 120 according to example embodiments of the inventive concept.

Referring to FIGS. 1 and 2, the memory device 120 may include a memory cell array 200, a row decoder 202, a word line driver 204, a column decoder 206, an input and output gating circuit 208, a control logic circuit 220, an address buffer 230, a command buffer 240, a command decoder 250, a data input buffer 260, and a data output buffer 270. The memory device 120 may further include a clock buffer, a mode register set (MRS), a voltage generation circuit, a refresh control circuit, etc.

The memory cell array 200 may include a plurality of memory cells provided in a matrix form in which the memory cells are arranged in rows and columns. The memory cell array 200 may include a plurality of word lines WL and a plurality of bit lines BL connected to the memory cells. The plurality of word lines WL may be connected to the rows of the memory cells, and the plurality of bit lines BL may be connected to the columns of the memory cells.

Figure 6:
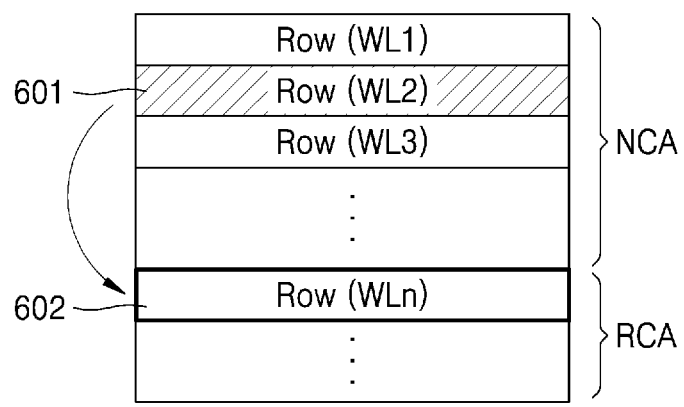
Figure 7:
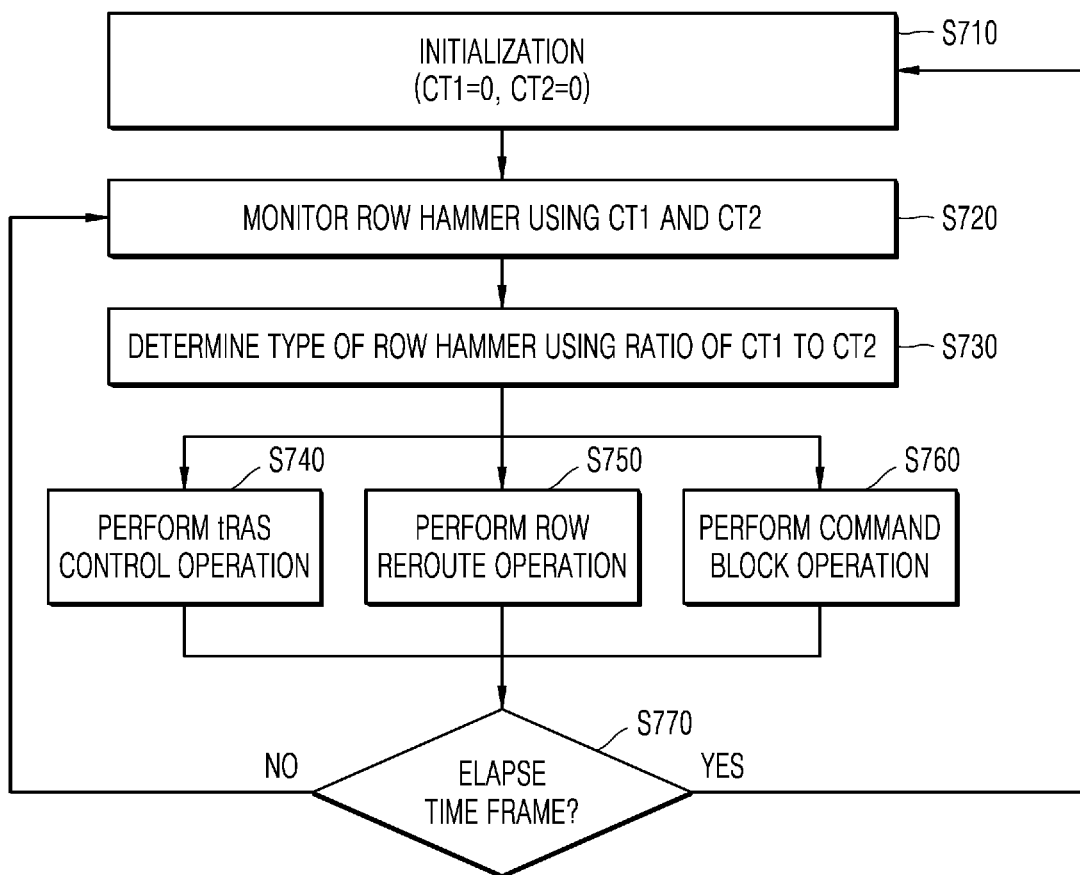
FIGS. 7, 8, 9 and 10 are flow diagrams for describing an operation of the row hammer control circuit of FIG. 3.

Data of the memory cells connected to an activated word line WL may be sensed and amplified by sensing amplifiers connected to the bit lines BL. The memory cell array 200 may include a first bank BANK1, a second bank BANK2, a third bank BANK3 and a fourth bank BANK4. Each of the first through fourth banks BANK1 through BANK4 may include a normal cell array NCA (FIG. 6) and a redundancy cell array RCA (FIG. 6). When a memory cell in the normal cell array NCA is determined to be a fail, the memory cell may be repaired by using a redundancy memory cell in the redundancy cell array RCA. The present embodiment illustrates an example of the memory device 120 that includes four banks. However, according to an example embodiment of the inventive concept, the memory device 120 may include an arbitrary number of banks. For example, the memory device 120 may include more than four banks.

The row decoder 202 may select any one of the plurality of word lines WL of the memory cell array 200. The row decoder 202 may decode a row address ROW_ADDR received from the address buffer 230 and select a word line WL corresponding to the row address ROW_ADDR and may connect the selected word line WL to the word line driver 204 configured to activate the selected word line WL.

The column decoder 206 may select predetermined bit lines BL from among the plurality of bit lines BL of the memory cell array 200. The column decoder 206 may generate a column selection signal by decoding a column address COL_ADDR received from the address buffer 230 and may connect the bit lines BL selected according to the column selection signal to the input and output gating circuit 208.

The input and output gating circuit 208 may include read data latches configured to store read data of the bit lines BL selected according to the column selection signal and a write driver configured to write the write data in the memory cell array 200. The read data stored in the read data latches of the input and output gating circuit 208 may be provided to a data bus through the data output buffer 270 and output as data DQ to the host device 110. The write data output from the host device as data DQ may be applied to the memory cell array 200 through the data input buffer 260 connected to the data bus and the write driver of the input and output gating circuit 208.

The command decoder 250 may decode a command signal CMD received by the command buffer 240 and provide a command corresponding to the decoded command signal CMD, for example, an active command ACT, a write command WR, a read command RD, a pre-charge command PRECHARGE, etc., to the control logic circuit 220.

The control logic circuit 220 may receive the dock signal CLK and the command CMD and may generate control signals for controlling an operation timing and/or a memory operation of the memory device 120. The control logic circuit 220 may provide the control signals to circuits of the memory device 120 so that the memory device 120 may perform according to configurations set in operation and control parameters stored in an MRS. The control logic circuit 220 may read data from the memory cell array 200 and write data in the memory cell array 200 by using the control signals.

The row hammer control circuit 210 may adjust a pre-charge preparation time by changing a pre-charge operation time point in response to a pre-charge command, may reroute rows such that another memory cell row is accessed, or may block commands of the memory device 120, according to a type of row hammer of a specific memory cell row during a row hammer monitor time frame.

Figure 3:
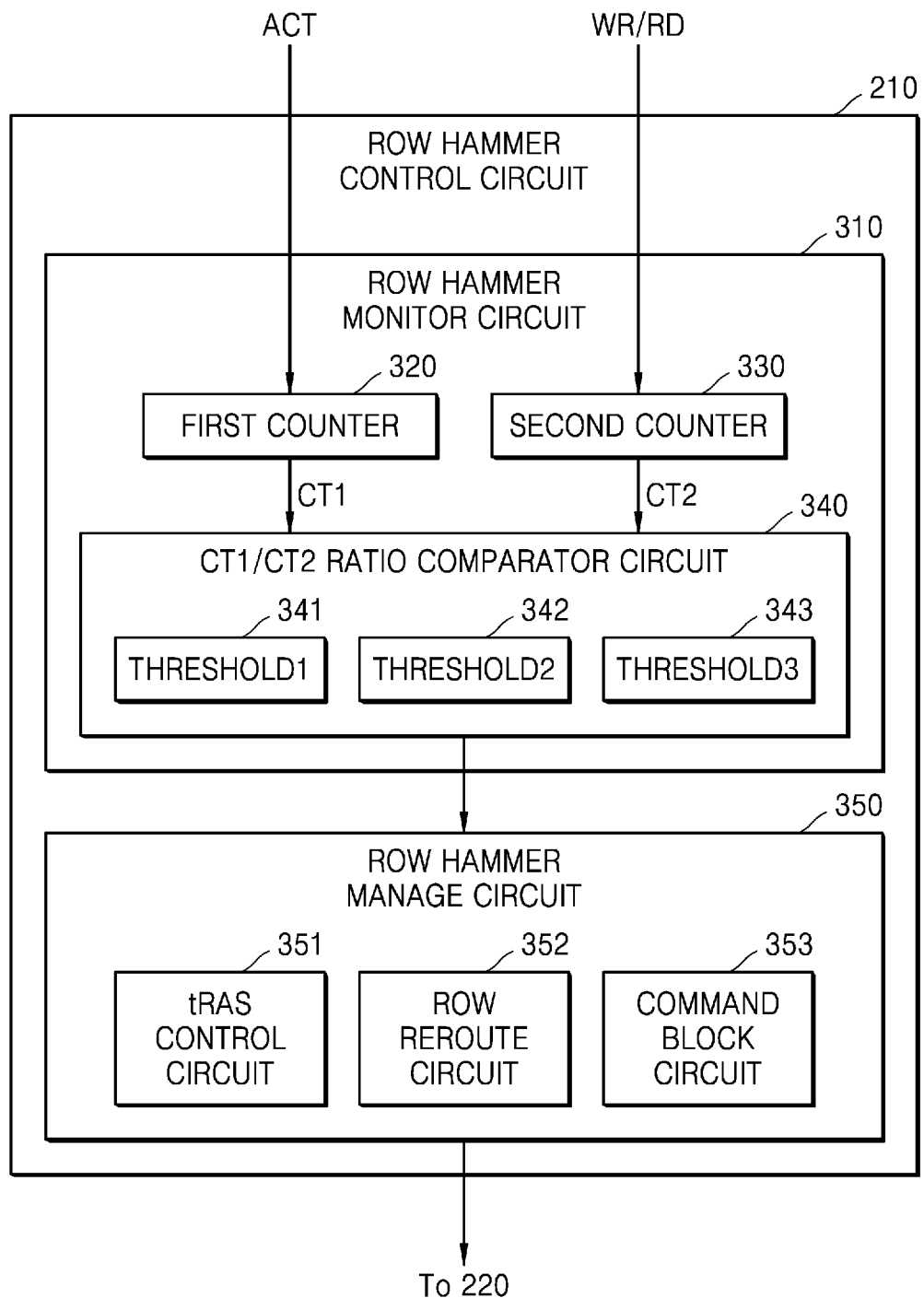
FIG. 3 is a block diagram of a row hammer control circuit of FIG. 2.
Figure 4A:
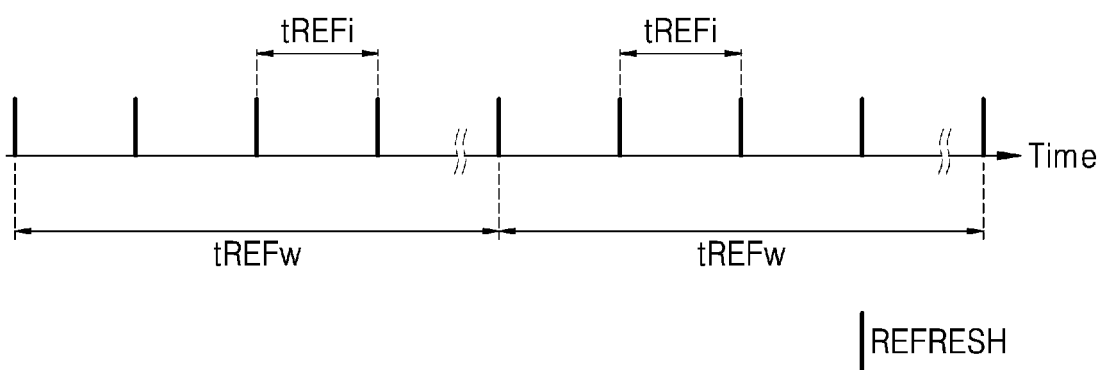
FIGS. 4A and 4B diagrams for describing a refresh operation and a bank active operation of the memory device of FIG. 2.
Figure 4B:
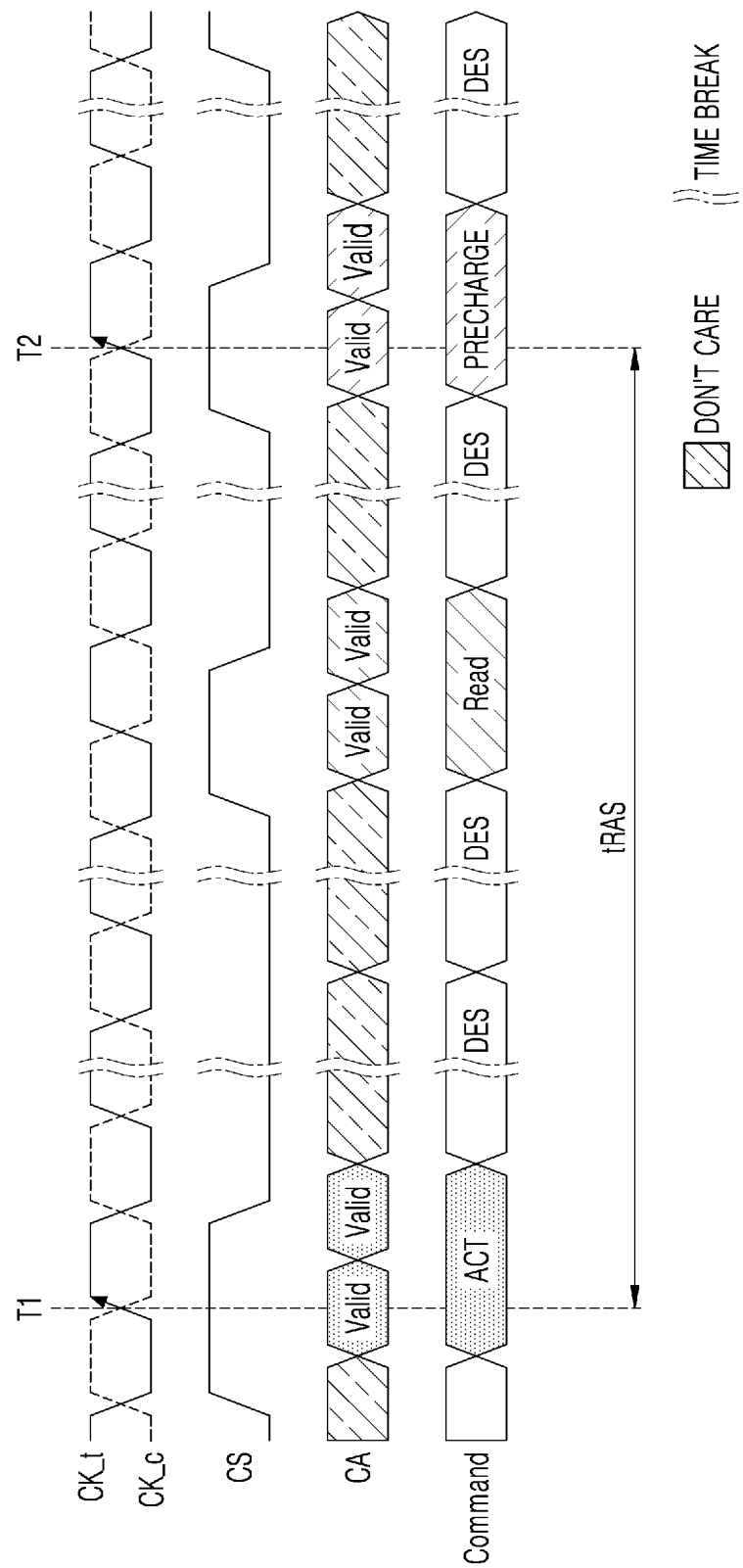
Figure 5:
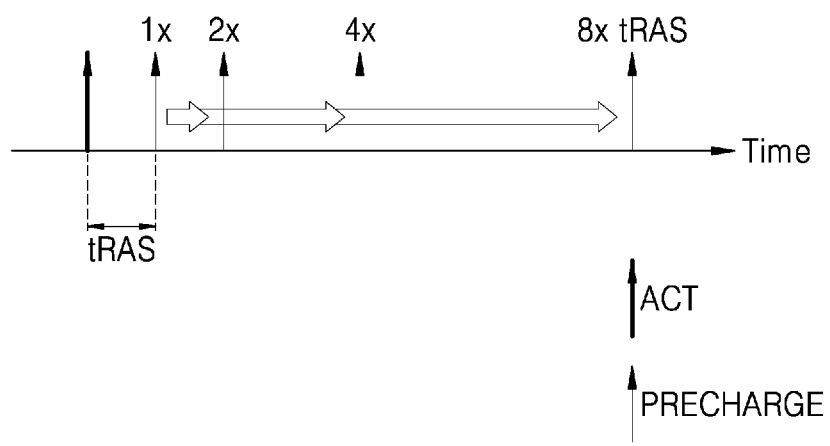
FIGS. 5 and 6 are diagrams for describing an operation of a row hammer manage circuit of FIG. 3.

FIG. 3 is a block diagram of the row hammer control circuit 210 of FIG. 2. FIGS. 4A and 4B diagrams for describing a refresh operation and a bank active operation of the memory device 120 of FIG. 2. FIGS. 5 and 6 are diagrams for describing an operation of a row hammer manage circuit 350 of FIG. 3. Hereinafter, the row hammer control circuit 210 commonly refers to hardware, firmware, software, or a combination thereof, configured to control or manage row hammer.

Referring to FIGS. 2 and 3, the row hammer control circuit 210 may be configured to monitor row hammer with respect to one or more memory cell rows in the memory cell array 200 and control the row hammer according to a type of row hammer of a specific memory cell row. The specific memory cell row refers to a memory cell row having the largest number of accesses or the largest number of active commands during a predetermined time period. The predetermined time period may be set as a refresh window time tREFw of 32 ms or 64 ms, defined in the JEDEC standards, as illustrated in FIG. 4A. According to an example embodiment of the inventive concept, the predetermined time period may be set as a basic refresh rate time tREFi of FIG. 4A. A basic refresh rate may be defined, for example, by the number of refresh commands REFRESH of about 8K within the refresh window time of 32 ms. Hereinafter, the predetermined time period may be referred to as a row hammer monitor time frame or a time window set by the control logic circuit 220.

The row hammer control circuit 210 may include a row hammer monitor circuit 310 and a row hammer manage circuit 350. The row hammer monitor circuit 310 may monitor the row hammer by calculating the number of active commands ACT and the number of write or read commands WR/RD with respect to at least one memory cell row and may determine a type of row hammer with respect to a specific memory cell row based on a ratio between the number of active commands ACT and the number of write or read commands WR/RD. The row hammer monitor circuit 310 may include a first counter 320 configured to provide a first count value CT1, a second counter 330 configured to provide a second count value CT2, and a ratio comparator circuit 340 of count values. The first count value CT1 may correspond to the number of active commands ACT and the second count value CT2 may correspond to the number of write or read commands WR/RD.

During the row hammer monitor time frame, the first counter 320 may provide, to the ratio comparator circuit 340, the first count value CT1 obtained by counting the number of active commands ACT provided from the command decoder 250, and the second counter 330 may provide, to the ratio comparator circuit 340, the second count value CT2 obtained by counting the write or read commands WR/RD provided by the command decoder 250.

According to an example embodiment of the inventive concept, the row hammer monitor circuit 310 may be connected to the data input buffer 260 and the data output buffer 270 configured to transmit the write data DQ or the read data DQ in response to the write command WR or the read command RD. In this case, the second counter 330 of the row hammer monitor circuit 310 may provide the second count value CT2 by counting the number of data transmissions and receptions through a data bus during the row hammer monitor time frame.

The ratio comparator circuit 340 may calculate a ratio between the first count value CT1 and the second count value CT2 to determine the type of row hammer. The ratio may be a ratio of the first count value CT1 to the second count value CT2, in other words, a CT1/CT2 ratio. The CT1/CT2 ratio may be compared with a plurality of threshold values stored in first, second and third registers 341, 342 and 343. A first threshold value THRESHOLD1 may be stored in the first register 341, a second threshold value THRESHOLD2 that is greater than the first threshold value THRESHOLD1 may be stored in the second register 342, and a third threshold value THRESHOLD3 that is greater than the second threshold value THRESHOLD2 may be stored in the third register 343. It is to be understood that additional registers may be included in the ratio comparator circuit 340. For example, the ratio comparator circuit 340 may include a fourth register storing a fourth threshold value. The first threshold value THRESHOLD1 may be set as a minimum threshold value corresponding to a relatively small number of active commands ACT, and the third threshold value THRESHOLD3 may be set as a maximum threshold value corresponding to a relatively large number of active commands ACT.

The ratio comparator circuit 340 may determine the type of row hammer by comparing the CT1/CT2 ratio with the first through third threshold values THRESHOLD1 through THRESHOLD3. When the CT1/CT2 ratio exceeds the third threshold value THRESHOLD3, the ratio comparator circuit 340 may determine a strong row hammer. The count value ratio comparator circuit 340 may determine a middle row hammer when the CT1/CT2 ratio is between the second threshold value THRESHOLD2 and the third threshold value THRESHOLD3 and may determine a weak row hammer when the CT1/CT2 ratio is between the first threshold value THRESHOLD1 and the second threshold value THRESHOLD2. The type of row hammer determined by the ratio comparator circuit 340 may be provided to the row hammer manage circuit 350.

Based on the type of row hammer, the row hammer manage circuit 350 may perform operations for alleviating the row hammer, for example, 1) an operation of adjusting a pre-charge preparation time by changing a pre-charge operation time point in response to a pre-charge command, 2) an operation of rerouting rows, 3) an operation of blocking commands, etc. A tRAS time may be a time between a time point at which an active command ACT is applied to a bank of the memory cell array 200 and a time point at which a pre-charge command PRECHARGE is applied to the same bank of the memory cell array 200, according to the JEDEC standards. As illustrated in FIG. 4B, a time between the active command ACT at a time point T1 and the pre-charge command PRECHARGE at a time point T2 indicates a tRAS time parameter. During the tRAS time, data of memory cells connected to selected word lines WL of the same bank according to the active command ACT may be restored in the memory cells after a sensing and amplifying operation of bit lines BL. Accordingly, the tRAS time may be referred to as a bank active time. However, with respect to the tRAS time parameter, when a pre-charge operation of the bit lines BL in response to the pre-charge command PRECHARGE is performed earlier than the restoring operation of the memory cells, data corruption, such as a bit flip, may occur.

The row hammer manage circuit 350 may include a tRAS control circuit 351, a row reroute circuit 352, and a command block circuit 353. The tRAS control circuit 351 may increase the pre-charge preparation time by changing the pre-charge operation time point in response to the pre-charge command, according to the type of row hammer. For example, the tRAS control circuit 351 may increase the pre-charge preparation time by delaying the pre-charge operation time point and may support the restoring operation of the memory cells to be performed for a sufficient time period. The tRAS control circuit 351 may delay the operation time point of the pre-charge command PRECHARGE after the active command ACT, to increase the pre-charge preparation time to 2×, 4×, or 8× the tRAS time parameter.

The row reroute circuit 352 may change a memory cell row determined to correspond to a strong row hammer, from among types of the row hammer, to another memory cell row. In FIG. 6, the memory cell array 200 may include the normal cell array NCA and the redundancy cell array RCA, and a defective memory cell row of the normal cell array NCA may be repaired by using a memory cell row of the redundancy cell array RCA. For purposes of distinction, the memory cell row of the normal cell array NCA is referred to as a normal cell row, and the memory cell row of the redundancy cell array RCA is referred to as a redundancy cell row. The row reroute circuit 352 may replace a normal cell row 601 corresponding to the strong row hammer with a redundancy cell row 602, as illustrated in FIG. 6. When a memory cell row of a strong row hammer is accessed, the row reroute circuit 352 may support access to a redundancy memory cell row, instead of the memory cell row of the strong row hammer.

The command block circuit 353 may block the command CMD applied to the memory device 120, when a memory cell row is determined to correspond to a strong row hammer, from among the types of the row hammer. The command block circuit 353 may block the command CMD by disabling the command buffer 240, to prevent a failure due to the strong row hammer.

The row hammer control circuit 210 may adjust the pre-charge preparation time by changing the pre-charge operation time point in response to the pre-charge command, reroute the rows, or block the pre-charge command, according to the type of row hammer, which is determined based on the ratio between the number of active commands and the number of write or read commands, during the row hammer monitor time frame, and thus, may alleviate the row hammer of the memory device 120.

FIGS. 7 through 10 are flow diagrams for describing an operation of the row hammer control circuit 210 of FIG. 3.

Referring to FIGS. 1, 2, 3, and 7, the system 100 may perform initialization in operation S710. When the system 100 is powered-up, the memory controller 112 and the memory device 120 may perform an initial setting operation according to a predetermined method. During the initialization of the memory device 120, default operation parameters may be set. For example, the first count value CT1 and the second count value CT2 of the row hammer monitor circuit 310 may be reset as 0. In addition, during the initialization of the memory device 120, a supplier or a user of the system 100 may set the row hammer monitor time frame and may set the first through third threshold values THRESHOLD1 through THRESHOLD3 that are criteria for determining the type of row hammer. The present embodiment illustrates an example in which the three threshold values THRESHOLD1 through THRESHOLD3 are set. However, according to an embodiment, various numbers of threshold values may be set. For example, fewer than three threshold values or more than three threshold values may be set.

In operation S720, the row hammer control circuit 210 may monitor row hammer by calculating the number of active commands ACT and the number of write or read commands WR/RD with respect to at least one memory cell row. The row hammer control circuit 210 may monitor the row hammer by calculating the first count value CT1 obtained by counting the number of active commands ACT and the second count value CT2 obtained by counting the number of write or read commands WR/RD during the row hammer monitor time frame. According to an example embodiment of the inventive concept, the second count value CT2 may be provided by counting the number of data transmissions and receptions through a data bus.

In operation S730, the row hammer control circuit 210 may determine the type of row hammer based on a ratio between the first count value CT1 and the second count value CT2. The row hammer control circuit 210 may determine a weak row hammer, a middle row hammer, and a strong row hammer according to the CT1/CT2 ratio. Thereafter, the row hammer control circuit 210 may adjust the pre-charge preparation time by changing the pre-charge operation time point in response to the pre-charge command (S740), may reroute the rows (S750), or may block the commands (S760), according to the determined type of row hammer, to control the row hammer.

Figure 8:
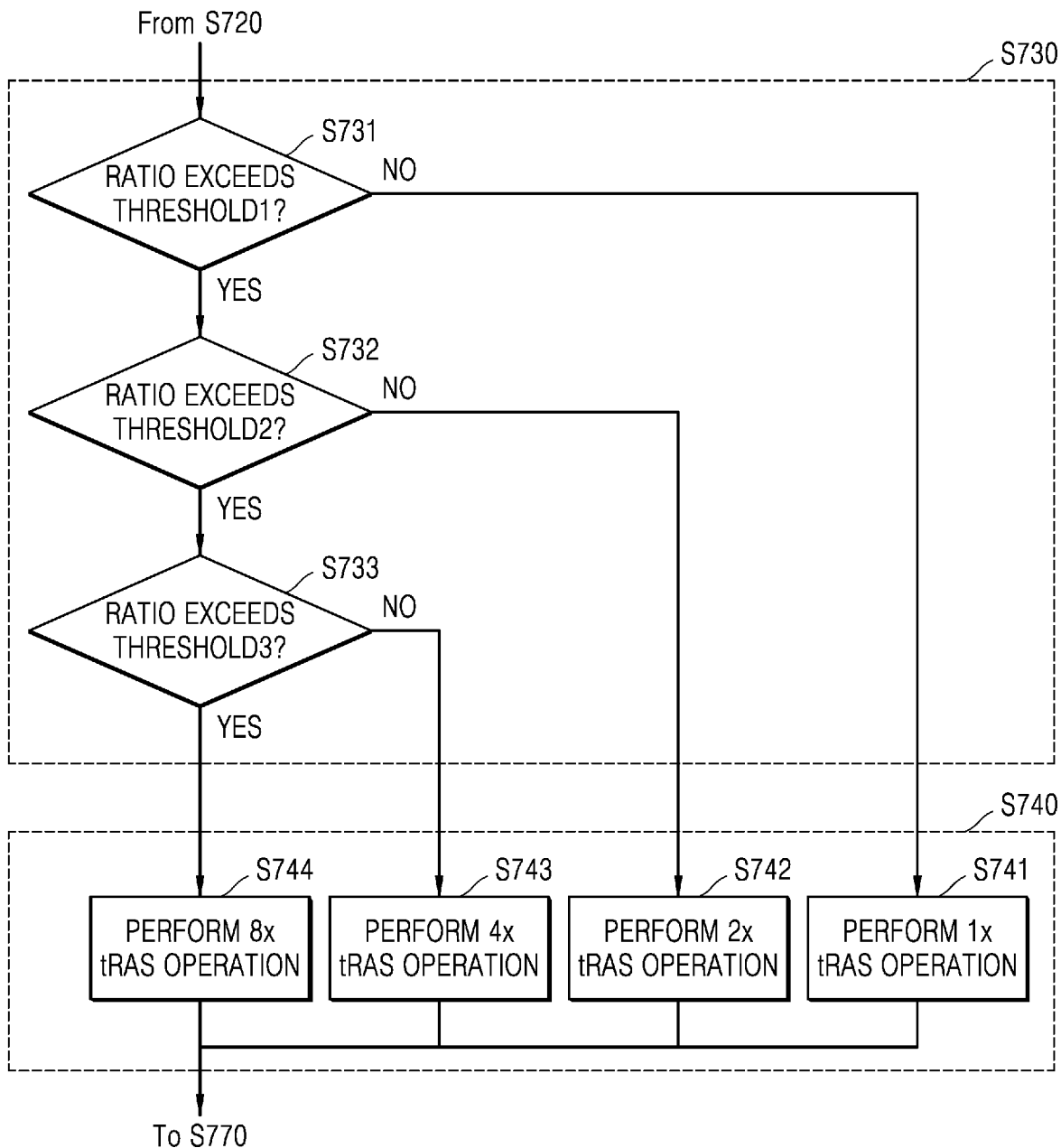

The row hammer control circuit 210 may perform the operation of determining the type of row hammer S730 including operations S731 through S733, as illustrated in FIG. 8. In operation S731, the row hammer control circuit 210 may compare the CT1/CT2 ratio with the first threshold value THRESHOLD1. In other words, the row hammer control circuit 210 may determine if the CT1/CT2 ratio exceeds the first threshold value THRESHOLD1. When the CT1/CT2 ratio does not exceed the first threshold value THRESHOLD1 (NO), the row hammer control circuit 210 may proceed to operation S741, and when the CT1/CT2 ratio exceeds the first threshold value THRESHOLD1 (YES), the row hammer control circuit 210 may proceed to operation S732. In operation S741, the row hammer control circuit 210 may determine that row hammer does not occur and may allow a bank active operation to be performed during a normal 1xtRAS time.

In operation S732, the row hammer control circuit 210 may compare the CT1/CT2 ratio with the second threshold value THRESHOLD2. In other words, the row hammer control circuit 210 may determine if the CT1/CT2 ratio exceeds the second threshold value THRESHOLD2. When the CT1/CT2 ratio does not exceed the second threshold value THRESHOLD2 (NO), the row hammer control circuit 210 may proceed to operation S742, and when the CT1/CT2 ratio exceeds the second threshold value THRESHOLD2 (YES), the row hammer control circuit 210 may proceed to operation S733. In operation S742, the row hammer control circuit 210 may determine that a weak row hammer between the first threshold value THRESHOLD1 and the second threshold value THRESHOLD2 occurs and may allow the bank active operation to be performed for a 2xtRAS time by doubling the tRAS time.

In operation S733, the row hammer control circuit 210 may compare the CT1/CT2 ratio with the third threshold value THRESHOLD3. In other words, the row hammer control circuit 210 may determine if the CT1/CT2 ratio exceeds the third threshold value THRESHOLD3. When the CT1/CT2 ratio does not exceed the third threshold value THRESHOLD3 (NO), the row hammer control circuit 210 may proceed to operation S743, and when the CT1/CT2 ratio exceeds the third threshold value THRESHOLD3 (YES), the row hammer control circuit 210 may proceed to operation S744. In operation S743, the row hammer control circuit 210 may determine that a middle row hammer between the second threshold value THRESHOLD2 and the third threshold value THRESHOLD3 occurs and may allow the bank active operation to be performed for a 4xtRAS time by quadrupling the tRAS time.

In operation S744, the row hammer control circuit 210 may determine that a strong row hammer occurs, when the CT1/CT2 ratio exceeds the third threshold value THRESHOLD3, and may allow the bank active operation to be performed for an 8xtRAS time by increasing the tRAS time for eight times.

With respect to the strong row hammer, when the row hammer control circuit 210 performs the bank active operation for the 8xtRAS time, the operation and performance of the system 100 may be greatly degraded. To prevent this, the row hammer control circuit 210 may proceed to operation S750 as illustrated in FIG. 9 or to operation S760 as illustrated in FIG. 10, when the CT1/CT2 ratio exceeds the third threshold value THRESHOLD3 (YES).

Figure 9:
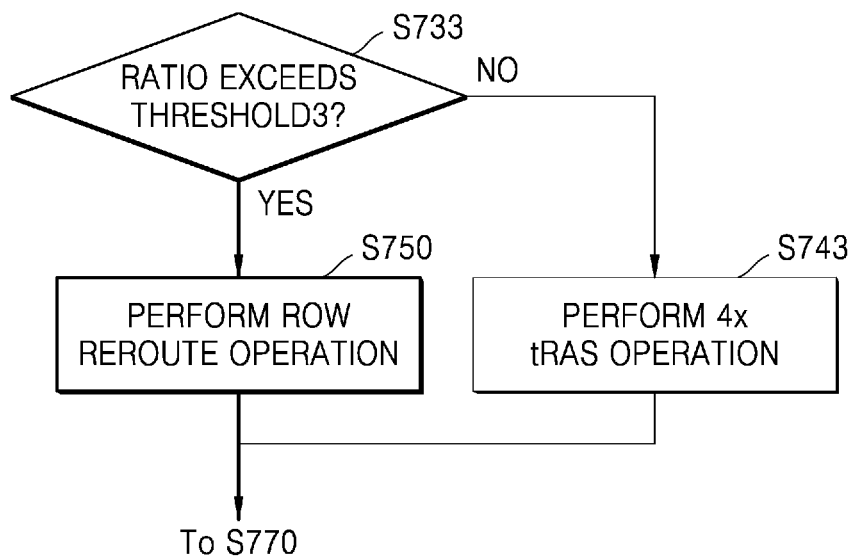

In operation S750 of FIG. 9, the row hammer control circuit 210 may change a memory cell row of the normal cell array NCA, which corresponds to the strong row hammer, with a redundancy cell row of the redundancy cell array RCA. Thus, when the memory cell row of the strong row hammer is accessed, the redundancy memory cell row may be accessed instead of the memory cell row of the strong row hammer.

Figure 10:
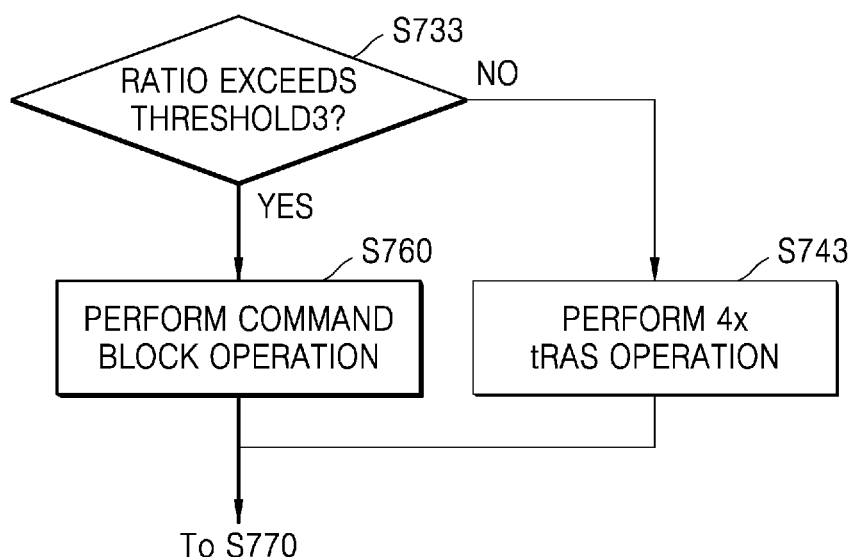

In operation S760 of FIG. 10, the row hammer control circuit 210 may block the command CMD applied to the memory device 120. The command block circuit 353 may block the command CMD by disabling the command buffer 240. Accordingly, the memory device 120 may prevent the failure due to the strong row hammer.

Again with reference to FIG. 7, the row hammer control circuit 210 may adjust the pre-charge preparation time by changing the pre-charge operation time point in response to the pre-charge command in operation S740, may reroute the rows in operation S750, or may block the command in operation S760, according to the type of row hammer, and then may proceed to operation S770.

In operation S770, the row hammer control circuit 210 may determine whether or not the row hammer monitor time frame elapses. When the row hammer monitor time frame has not elapsed (NO), the row hammer control circuit 210 may proceed to operation S720 and repeatedly perform the row hammer monitoring operation. When the row hammer monitor time frame is elapsed (YES), the row hammer monitor circuit 210 may proceed to operation S710 and perform initialization of the memory device 120. Here, the first count value CT1 and the second count value CT2 may be reset as 0.

Figure 11:
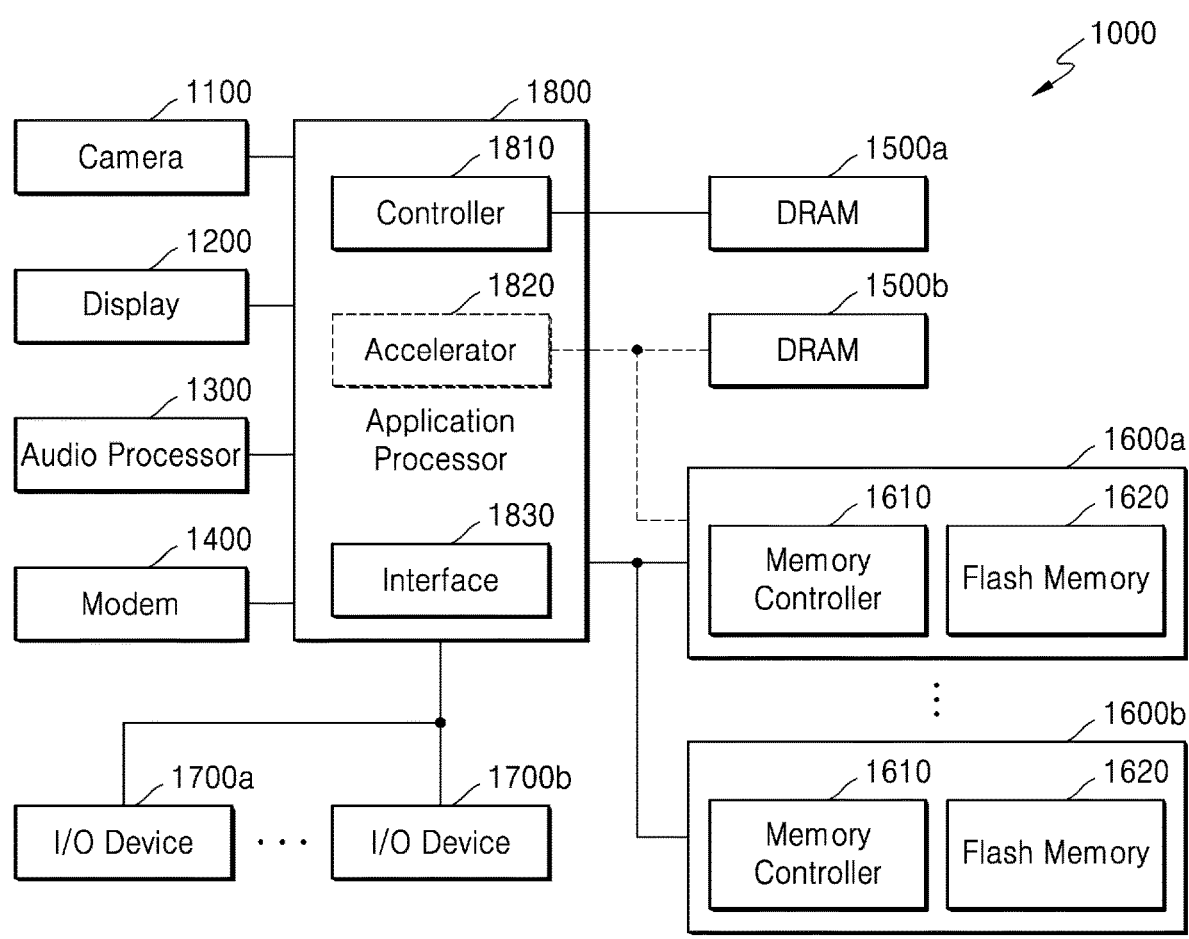
FIG. 11 is a block diagram of a system including a memory device for controlling row hammer, according to example embodiments of the inventive concept.

FIG. 11 is a block diagram of a system 1000 including a memory device for controlling row hammer, according to example embodiments of the inventive concept.

Referring to FIG. 11, the system 1000 may include a camera 1100, a display 1200, an audio processor 1300, a modem 1400, DRAMs 1500a and 1500b, flash memories 1600a and 1600b, input/output (I/O) devices 1700a and 1700b, and an AP 1800. The system 1000 may be implemented by a laptop computer, a mobile terminal, a smartphone, a tablet personal computer (PC), a wearable device, a health care device, or an Internet of Things (IoT) device. In addition, the system 1000 may be implemented by a server or a PC.

The camera 1100 may capture a still image or a video, store the captured image/video data, or transmit the captured image/video data to the display 1200, according to control by a user. The audio processor 1300 may process audio data included in the contents of the flash memories 1600a and 1600b or networks. The modem 1400 may modulate and transmit a signal for transmission and reception of wired/wireless data, and a receiving end may demodulate the signal to restore the original signal. The I/O devices 1700a and 1700b may include devices for providing a digital input and/or output function, such as a universal serial bus (USB), a storage, a digital camera, a secure digital (SD) card, a digital versatile disc (DVD), a network adapter, a touch screen, etc.

The AP 1800 may control general operations of the system 1000 using a controller 1810 and interface 1830. The AP 1800 may control the display 1200 to display a portion of the contents stored in the flash memories 1600a and 1600b. When a user input is received through the I/O devices 1700a and 1700b, the AP 1800 may perform a control operation corresponding to the user input. The AP 1800 may include an accelerator block, which is an exclusive circuit for artificial intelligence (AI) data calculation, or an accelerator chip 1820 may be separately provided from the AP 1800. The DRAM 1500b may be additionally mounted in the accelerator block or the accelerator chip 1820. The accelerator may be a functional block specialized in a specific function of the AP 1800 and may include a GPU, which is a functional block specialized in graphics data processing, a neural processing unit (NPU), which is a block specialized in AI calculations and inference, and a data processing unit (DPU), which is a block specialized in data transmission.

The system 1000 may include the plurality of DRAMs 1500a and 1500b. The AP 1800 may control the DRAMs 1500a and 1500b according to a command and an MRS complying with the JEDEC standards or may perform communication by setting a DRAM interface regulation to use a business-exclusive function related to low voltage/high speed/reliability and a cyclic redundancy check (CRC)/error correction code (ECC) function. For example, the AP 1800 may communicate with the DRAM 1500a by using an interface according to the JEDEC standards, such as LPDDR4, LPDDR5, etc., and may communicate with the DRAM 1500b by setting a new DRAM interface regulation to control the DRAM 1500b for the accelerator that has a greater band width than the DRAM 1500a.

FIG. 11 illustrates only the DRAMs 1500a, and 1500b. However, the inventive concept is not limited thereto, and any one of the memories, such as phase-change random access memory (PRAM), static random-access memory (SRAM), magneto-resistive random access memory (MRAM), resistive random access memory (RRAM), ferroelectric random access memory (FRAM), or hybrid random access memory (RAM), that satisfies conditions about a bandwidth, a response rate, and a voltage with respect to the AP 1800 or the accelerator chip 1820, may be used. The DRAMs 1500a and 1500b may have a relatively less latency and a relatively less bandwidth than the I/O devices 1700a and 1700b or the flash memories 1600a and 1600b. The DRAMs 1500a and 1500b may be initialized at a power on time point of the system 1000, and loaded with an operating system and application data, the DRAMs 1500a and 1500b may be used as a temporary storage of the operating system and the application data or as an execution space of various software codes.

In the DRAMs 1500a and 1500b, the four fundamental arithmetic operations of addition/subtraction/multiplication/division, a vector operation, an address operation, or a fast Fourier transform (FFT) operation may be performed. In addition, in the DRAMs 1500a and 1500b, a function for inference may be performed. Here, the inference may be performed by a deep learning algorithm using an artificial neural network. The deep learning algorithm may include a training operation in which a model is trained by using various data and an inference operation in which the trained model recognizes data. According to an example embodiment of the inventive concept, an image captured by a user by using the camera 1100 may be signal processed and stored in the DRAM 1500b, and the accelerator block or the accelerator chip 1820 may perform AI data calculation for recognizing data by using data stored in the DRAM 1500b and the function for inference.

The system 1000 may include a plurality of storages or the plurality of flash memories 1600a and 1600b having greater capacities than the DRAMs 1500a and 1500b. The accelerator block or the accelerator chip 1820 may perform the training operation and the AI data calculation by using the flash memories 1600a and 1600b. According to an example embodiment of the inventive concept, the flash memories 1600a and 1600b may perform the training operation and the AI data calculation of inference, which are performed by the AP 1800 and/or the accelerator chip 1820, more efficiently than the AP 1800 and/or the accelerator chip 1820, by using a calculation device included in a memory controller 1610. The flash memories 1600a and 1600b may store a photograph captured by the camera 1100 or store data transmitted from a data network. For example, augmented reality (AR)/virtual reality (VR), high definition (HD), or ultra-high definition (UHD) contents may be stored.

The system 1000 may determine a type of row hammer with respect to the DRAMs 1500a and 1500b based on a ratio between the number of active commands and the number of write or write commands during a row hammer monitor time frame, and based on the determined type of row hammer, the system 1000 may change a pre-charge operation time point in response to a pre-charge command to adjust a pre-charge preparation time, reroute the rows, or block the commands in order to alleviate the row hammer of the DRAMs 1500a and 1500b.

While the inventive concept has been particularly shown and described with reference to embodiments thereof, it will be understood that various changes in form and details may be made therein without departing from the spirit and scope of the following claims.

What is claimed is:

1. A memory device, comprising:
a memory cell array including a plurality of memory cell rows;
a plurality of connectors for connecting the memory device to a device outside of the memory device;
a control logic circuit configured to perform a row operation, a write operation, a read operation, or a pre-charge operation on the plurality of memory cell rows in response to an active command, a write command, a read command, or a pre-charge command received from the outside; and
an input and output circuit configured to transmit data according to the write operation or the read operation to the plurality of connectors,
wherein the control logic circuit is further configured to:
calculate a first count value by counting the active command and a second count value by counting the write command or the read command, with respect to a first memory cell row from among the plurality of memory cell rows, during a row hammer monitor time frame; determine a type of row hammer of the first memory cell row based on a ratio of the first count value to the second count value; and adjust a pre-charge preparation time between an active operation and the pre-charge operation, by changing a pre-charge operation time point according to the determined type of row hammer.

2. The memory device of claim 1, wherein the first memory cell row has a largest number of accesses from the device outside the memory device during the row hammer monitor time frame.

3. The memory device of claim 1, wherein the control logic circuit includes registers configured to store first, second and third threshold values that are used to determine the type of row hammer, and
the first threshold value is a smallest value of the first through third threshold values, and the third threshold value is a largest value of the first through third threshold values.

4. The memory device of claim 3, wherein the control logic circuit is further configured, when the ratio is between the first threshold value and the second threshold value, to determine that a weak row hammer occurs in the first memory cell row and increase the pre-charge preparation time to a first time.

5. The memory device of claim 4, wherein the first time is twice a tRAS time parameter between the active command and the pre-charge command.

6. The memory device of claim 4, wherein the control logic circuit is further configured, when the ratio is between the second threshold value and the third threshold value, to determine that a middle row hammer occurs in the first memory cell row and increase the pre-charge preparation time to a second time that is greater than the first time.

7. The memory device of claim 6, wherein the second time is four times a tRAS time parameter between the active command and the pre-charge command.

8. The memory device of claim 6, wherein the control logic circuit is further configured, when the ratio exceeds the third threshold value, to determine that a strong row hammer occurs in the first memory cell row and increase the pre-charge preparation time to a third time that is greater than the second time.

9. The memory device of claim 8, wherein the third time is eight times a tRAS time parameter between the active command and the pre-charge command.

10. The memory device of claim 1, wherein the control logic circuit is further configured to obtain the second count value based on the data transmitted through the input and output circuit.

11. The memory device of claim 1, wherein the control logic circuit is further configured to use a refresh window time (tREFw) in the memory device as the row hammer monitor time frame.

12. The memory device of claim 1, wherein the control logic circuit is further configured to use a basic refresh rate time OR M) in the memory device as the row hammer monitor time frame.

13. The memory device of claim 1, wherein the control logic circuit is further configured to reset the first count value and the second count value after the row hammer monitor time frame elapses.

14. An operating method of a memory device including a plurality of memory cell rows, the operating method comprising:
obtaining a first count value by counting an active command with respect to a first memory cell row from among the plurality of memory cell rows during a row hammer monitor time frame, wherein the first memory cell row has a largest number of accesses during the row hammer monitor time frame;

obtaining a second count value by counting a write command or a read command with respect to the first memory cell row during the row hammer monitor time frame;

determining a type of row hammer of the first memory cell row based on a ratio of the first count value to the second count value; and adjusting a pre-charge preparation time between an active operation in response to the active command and a pre-charge operation in response to a pre-charge command of the memory device by changing a pre-charge operation time point according to the determined type of row hammer.

15. The operating method of claim 14, further comprising performing a row-rerouting operation in which access to the first memory cell row is changed to a second memory cell, according to the determined type of row hammer.

16. The operating method of claim 14, further comprising blocking the active, write, read or pre-charge commands by disabling a command buffer of the memory device, according to the deter lined type of row hammer.

17. The operating method of claim 14, wherein the obtaining of the second count value includes obtaining the second count value based on data transmitted through an input and output circuit of the memory device.

18. The operating method of claim 14, wherein the row hammer monitor time frame is a refresh window time (tREFw) in the memory device.

19. The operating method of claim 14, wherein the row hammer monitor time frame is a basic refresh rate time (tREFi) in the memory device.

20. The operating method of claim 14, further comprising resetting the first count value and the second count value after the row hammer monitor time frame elapses.

* * * * *